United States Patent
Koshizuka

Patent Number: 5,852,585
Date of Patent: Dec. 22, 1998

[54] ADDRESSING UNIT

[75] Inventor: Atsuo Koshizuka, Tokyo, Japan

[73] Assignee: Nippon Steel Corporation, Tokyo, Japan

[21] Appl. No.: 864,924

[22] Filed: May 29, 1997

[30] Foreign Application Priority Data

May 31, 1996 [JP] Japan .................................. 8-161064

[51] Int. Cl.⁶ .................................................. G11C 8/00
[52] U.S. Cl. ................................ 365/230.08; 365/238.5; 365/236
[58] Field of Search ...................... 365/230.08, 230.06, 365/230.01, 236, 238.5

[56] References Cited

U.S. PATENT DOCUMENTS

| | | | |
|---|---|---|---|
| 4,811,294 | 3/1989 | Kobayashi et al. | 365/230.08 |
| 4,985,868 | 1/1991 | Nakano et al. | 365/230.08 |
| 5,083,296 | 1/1992 | Hara et al. | 365/230.08 |
| 5,426,606 | 6/1995 | Takai | 365/230.06 |
| 5,526,320 | 6/1996 | Zagar et al. | 365/238.5 |
| 5,604,714 | 2/1997 | Manning et al. | 365/230.08 |
| 5,610,874 | 3/1997 | Park et al. | 365/230.06 |
| 5,629,903 | 5/1997 | Agata | 365/230.06 |
| 5,666,323 | 9/1997 | Zagar | 365/230.06 |
| 5,694,370 | 12/1997 | Yoon | 365/238.5 |
| 5,701,273 | 12/1997 | Choi | 365/233.5 |

*Primary Examiner*—Tan T. Nguyen
*Attorney, Agent, or Firm*—Pollock, Vande Sande & Priddy

[57] ABSTRACT

In an addressing unit fort reducing a wasteful time created to reach an address latch to attain fast processing, a pre-decoder for pre-decoding an X address and a Y address is provided in a preceding stage to the address latch, the address signal pre-decoded by the pre-decoder is latched in the address latch and the latched address signal is decoded by a decoder. Thus, the pre-decode process can be conducted in the same time period required to latch the address signal in a conventional unit in which the pre-decoder is arranged in a succeeding stage of the address latch circuit, and after the address latching, only the decode process is needed.

4 Claims, 6 Drawing Sheets

ADDRESSING UNIT

BACKGROUND OF THE INVENTION

1. Field of the Invention

The present invention relates to an addressing unit, and more particularly to an addressing unit suitable for a storage device which reads and writes information by using an X address (row address) and a Y address (column address).

2. Description of the Related Art

Various storage devices for storing information have been proposed. Among them, a storage device which reads and writes information by using the X address and the Y address has been known. FIG. 4 shows a prior art example of an addressing unit which used the X address and the Y address.

FIG. 4 shows an addressing unit used in a storage device represented by a DRAM. Namely, it shows a so-called address multiplex type addressing unit in which an address signal comprising multiplexed X address and Y address is inputted from an address input terminal common to the row and the column in a plurality of times in a time division fashion in order to reduce the number of address input terminals to improve a packaging density on a printed circuit board.

In FIG. 4, numeral 41 denotes a buffer which translates an address signal ad0 inputted from an address input terminal 8 to an internal X address signal ad1 to be supplied to an X decoder 6 and an internal Y address signal ad2 to be supplied to a Y decoder 7. By translation process, the address signal ad0 inputted from the address input terminal 8 is delayed by a certain period of time.

Numeral 2 denotes an internal control signal generation circuit which generates a control signal (X latch signal) φX0 for taking the X address and a control signal (Y latch signal) φY0 for taking the Y address.

When the X address is to be taken, the internal control signal generation circuit 2 supplies the X latch signal φX0 to an X address latch 43. Thus, the internal X address signal ad1 outputted from the buffer 41 is latched in the X address latch 43. When the Y address is to be taken, the Y latch signal φY0 is supplied to a Y address latch 44. Thus, the internal Y address signal ad2 outputted from the buffer 41 is latched in the Y address latch 44.

Numeral 45 denotes an X pre-decoder which temporarily decodes the internal X address signal ad1 latched in the X address latch 43, two bits at a time, before it is input to the X decoder. Namely, it decodes the input n-bit address signal to a signal which identifies $2^n$ address lines. For example, when the internal X address signal ad1 latched in the X address latch 43 is a 3-bit signal, the X pre-decoder 45 outputs an X pre-decoded signal ad3 for identifying eight addresses.

Numeral 46 denotes a Y pre-decoder which temporarily decodes the internal address signal ad2 latched in the Y address latch 44, two bits at a time, before it is input to the Y decoder 7. For example, when the internal T address signal ad2 latched in the Y address latch 44 is a 3-bit signal, a Y pre-decoded signal ad4 which identifies eight addresses is outputted from the Y pre-decoder 46.

The X decoder 6 generates and outputs an X select signal adX for selecting a word line of a memory cell (not shown) based on the X pre-decoded signal ad3 supplied from the X pre-decoder 45. The Y decoder 7 generates and outputs a Y select signal adY for selecting a bit line of the memory cell (not shown) based on the Y pre-decoded signal ad4 supplied from the Y pre-decoder 46.

In the case where the pre-decoders 45 and 46 are provided in front of the decoders 6 and 7, the number of transistors of the decoders 6 and 7 can be reduced and the process may be conducted faster in comparison with the case where the internal address signals ad1 and ad2 generated by the buffer 41 are directly inputted to the decoders 6 and 7.

FIG. 5 shows another prior art example of the addressing unit which uses the X address and the Y address. FIG. 5 shows a synchronous addressing unit. The blocks which are identical to those of the addressing unit as shown in FIG. 4 are designated by the identical numerals. Namely, in the addressing unit in FIG. 5, a burst counter 51 is used instead of the Y address latch 44 in FIG. 4. The burst counter 51 comprises a binary counter.

In the example of FIG. 4, a plurality of address data ad2 included in the internal Y address signal is sequentially supplied from the buffer 41 to the Y address latch 44 and latched therein, while in the example of FIG. 5, the first address data ad2' included in the internal Y address signal is latched in the burst counter 51 and then the burst counter 51 is counted up based on the address data so that all address data included in the internal Y address signal are sequentially generated.

As shown in FIG. 5, when the addressing unit is constructed synchronously by using the burst counter 51, the speed of the process is further increased than the addressing unit as shown in FIG. 4.

FIG. 6 is a time chart showing an operation to latch the internal X address signal ad1 in the X address latch 43. In FIG. 6, the address signal ad0 (Valid-Data) is kept to be a high level or a low level in a set-up period tS0 and a hold period tH0 in synchronism with a falling edge of the control signal φ0 (FIGS. 6(*a*) and (*b*)).

The address signal ad0 is translated to the internal X address signal ad1 by the buffer 41 and latched in the X address latch 43. The latching is conducted synchronous with the falling edge of the X latch signal φX0 supplied from the internal control signal generation circuit 2 to the X address latch 43 (FIGS. 6(*c*) and (*d*)). The X latch signal φX0 is a signal generated through the processing of the control signal φ0 by the internal control signal generation circuit 2, and a certain delay time dt0 is caused for a time period from the input of the control signal φ0 to the acquirement of the X latch signal φX0.

Under such a condition, in order to latch the internal X address signal ad1 in the X address latch 43 in synchronism with the falling edge of the X latch signal φX0, namely, in order to keep the value of the internal X address signal ad1 (Valid-data) in the set-up time tS1 and the hold time tH1 to be a high level or a low level in synchronism with the falling edge of the X latch signal φX0, it is necessary to match the delay time dt1 when the internal X address signal ad1 is generated in the buffer 41 from the address signal ad0, to the delay time dt0 in the internal control signal generation circuit 2.

However, the delay time caused in the generation of the internal X address signal ad1 in the buffer 41 is generally shorter than the delay time dt0 caused in the generation of the X latch signal φX0 in the internal control signal generation circuit 2. Accordingly, in the prior art, it is necessary to set the delay time in the buffer 41 wastefully long in order to latch the internal X address signal ad1 in the X address latch 43 in synchronism with the falling edge of the X latch signal φX0.

Namely, in spite of the fact that the process to translate the address signal ad0 to the internal X address signal ad1 in the buffer 41 is completed and it is ready to latch it in the X address latch 43, the X latch signal φX0 is not yet generated at that time and the delay of the buffer 41 is wastefully long. This renders the implementation of high speed processing difficult. This problem is serious in the addressing unit of FIG. 4 as well as the addressing unit of FIG. 5 which aims the further speed-up of the process.

SUMMARY OF THE INVENTION

It is an object of the present invention to solve the above problems and provides an addressing unit which reduces the wasteful delay time caused in the buffer 41 and attains a high speed operation.

In order to achieve the above object, an addressing unit in accordance with a first aspect of the present invention comprises a pre-decoder for pre-decoding an address signal, an address latch circuit for latching the pre-decoded address signal; and an address decoder for decoding the address signal outputted from the address latch circuit.

An addressing unit in accordance with a second aspect of the present invention comprises a pre-decoder for sequentially receiving a first address signal and a second address signal and pre-decoding the first and second address signals in a time division fashion, an address latch circuit for latching the pre-decoded first and second address signals, an address decoder for decoding the first and second address signals outputted from the address latch circuit, and a control signal generation circuit for generating a control signal for controlling a timing to latch the pre-decoded first and second address signals and supplying the control signal to the address latch circuit.

The address latch circuit may include a first address latch circuit for latching the pre-decoded first address signal and a second address latch circuit for latching the pre-decoded second address signal. The address decoder may include a first address decoder for decoding the first address signal outputted from the first address latch circuit and a second address decoder for decoding the second address signal outputted from the second address latch circuit.

The pre-decoder sequentially pre-decodes a plurality of address data included in the first address signal and pre-decodes first one of a plurality of address data included in the second address signal. The address latch circuit may include a first address latch circuit for latching a plurality of address data included in the pre-decoded first address signal and a shift register for latching first one of a plurality of address data included in the pre-decoded second address signal and sequentially shifting the latched address data to generate a plurality of address data. The address decoder may include a first address decoder for decoding the plurality of address data outputted from the first address latch circuit and a second address decoder for decoding the plurality of address data generated by the shift register.

Since the present invention is constructed by the technical means described above, the pre-decode process may be conducted by utilizing an idle time before the address signal is latched in the prior art unit in which the pre-decoder is arranged in a succeeding stage of the address latch circuit so that the pre-decode process may be conducted in the same time period as that required for the address latching in the prior art, and after the address latching is conducted, only the decode process may be conducted without conducting the pre-decode process.

DESCRIPTION OF THE PREFERRED EMBODIMENTS

The embodiments of the present invention will be explained with reference to the drawings.

Figure 1:
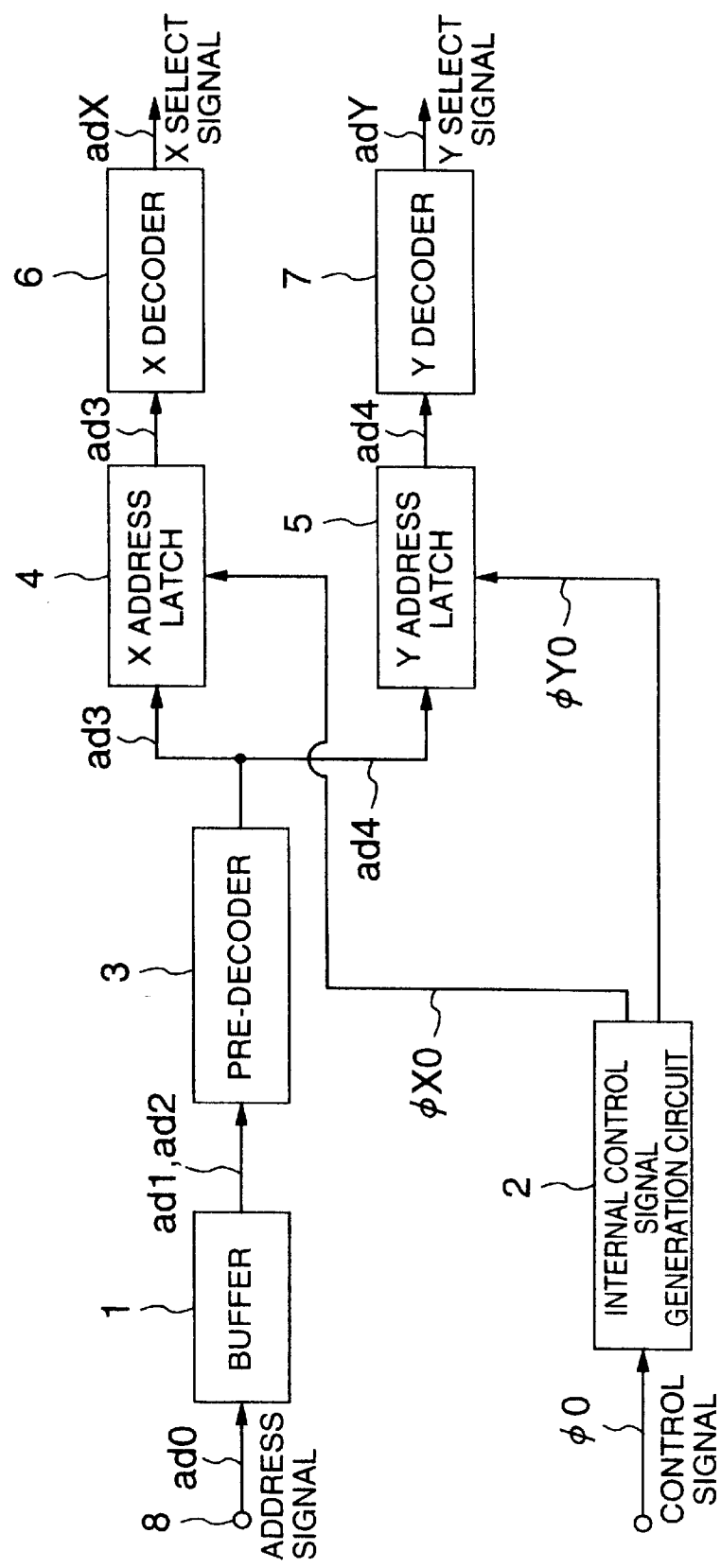
FIG. 1 is a block diagram of a configuration of an addressing unit according to a first embodiment.

FIG. 1 is a block diagram of a configuration of an addressing unit according to a first embodiment. FIG. 1 is to be compared with FIG. 4 which shows the prior art.

In FIG. 1, numeral 1 denotes a buffer which translates an address signal ad0 input from an address input terminal 8 to an internal X address signal ad1 to be sent to an X decoder 6 or an internal Y address signal to be sent to a Y decoder 7. The content of the translation in the buffer 1 is identical to that of the prior art buffer 41 shown in FIG. 4 for the most part, but in the present embodiment, as will be described later, the number of gates for the time delay included therein is smaller.

The internal X address signal ad1 and the internal Y address signal ad2 translated by the buffer 1 are supplied to a pre-decoder 3. The pre-decoder 3 temporarily decodes the internal X address signal ad1 and the internal Y address signal ad2 supplied from the buffer 1, two bits at a time, before they are input to the X decoder 6 or the Y decoder 7. For example, when the internal X address signal ad1 and the internal Y address signal ad2 outputted from the buffer 1 are 3-bit signals, the pre-decoder 3 outputs an X pre-decoded signal ad3 and a Y pre-decoded signal ad4 for identifying eight address lines onto eight signal lines.

Numeral 4 denotes an X address latch which latches the X pre-decoded signal ad3 output from the pre-decoder 3. Numeral 5 denotes a Y address latch which latches the Y pre-decoded signal ad4 output from the pre-decoder 3. The address latches 43 and 44 as shown in the prior art of FIG. 4 latch the 3-bit internal address signals ad1 and ad2, while the address latches 4 and 5 in the present embodiment latch the pre-decoded signals ad3 and ad4 pre-decoded by the pre-decoder 3 and for identifying the eight address lines.

The latching of the X pre-decoded signal ad3 and the Y pre-decoded signal ad4 into the address latches 4 and 5 is conducted in synchronism with an X latch signal φX0 and a Y latch signal φY0 generated through the processing of a control signal φ0 by the internal control signal generation circuit 2.

When the X pre-decoded signal ad3 is latched in the X address latch 4, the X decoder 6 generates and outputs an X select signal adX for selecting a word line of a memory cell (not shown) based on the latched X pre-decoded signal ad3. When the Y pre-decoded signal ad4 is latched in the Y address latch 5, the Y decoder 7 generates and outputs a Y select signal for selecting a bit line of the memory cell (not shown) based on the latched Y pre-decoded signal ad4.

As mentioned above, in the addressing unit according to the present embodiment, the X pre-decoder 45 and the Y pre-decoder 46 separately provided in the prior art for the X addressing and the Y addressing, are combined into one pre-decoder 3, and the pre-decoder 3 is arranged in the preceding stage to the X address latch 4 and the Y address latch 5 so as to latch the pre-decoded signal.

By this arrangement, the processes of the buffer 1 and the pre-decoder 3 can be conducted during the delay time required for the internal control signal generation circuit 2 to process the control signal φ0 to generate the X latch signal φX0 and the Y latch signal φY0 and supply them to the X address latch 4 and the Y address latch 5.

As described in the description of the prior art, the delay time caused by the translation process of the buffer 1 is shorter than the delay time caused by the process of the internal control signal generation circuit 2. Accordingly, an idle time occurs after the completion of the translation process by the buffer 1 and before the latching is actually conducted. Since the time required for the process of the pre-decoder 3 is substantially equal to or shorter than the idle time, the pre-decode process may be conducted by utilizing the idle time.

Figure 3:
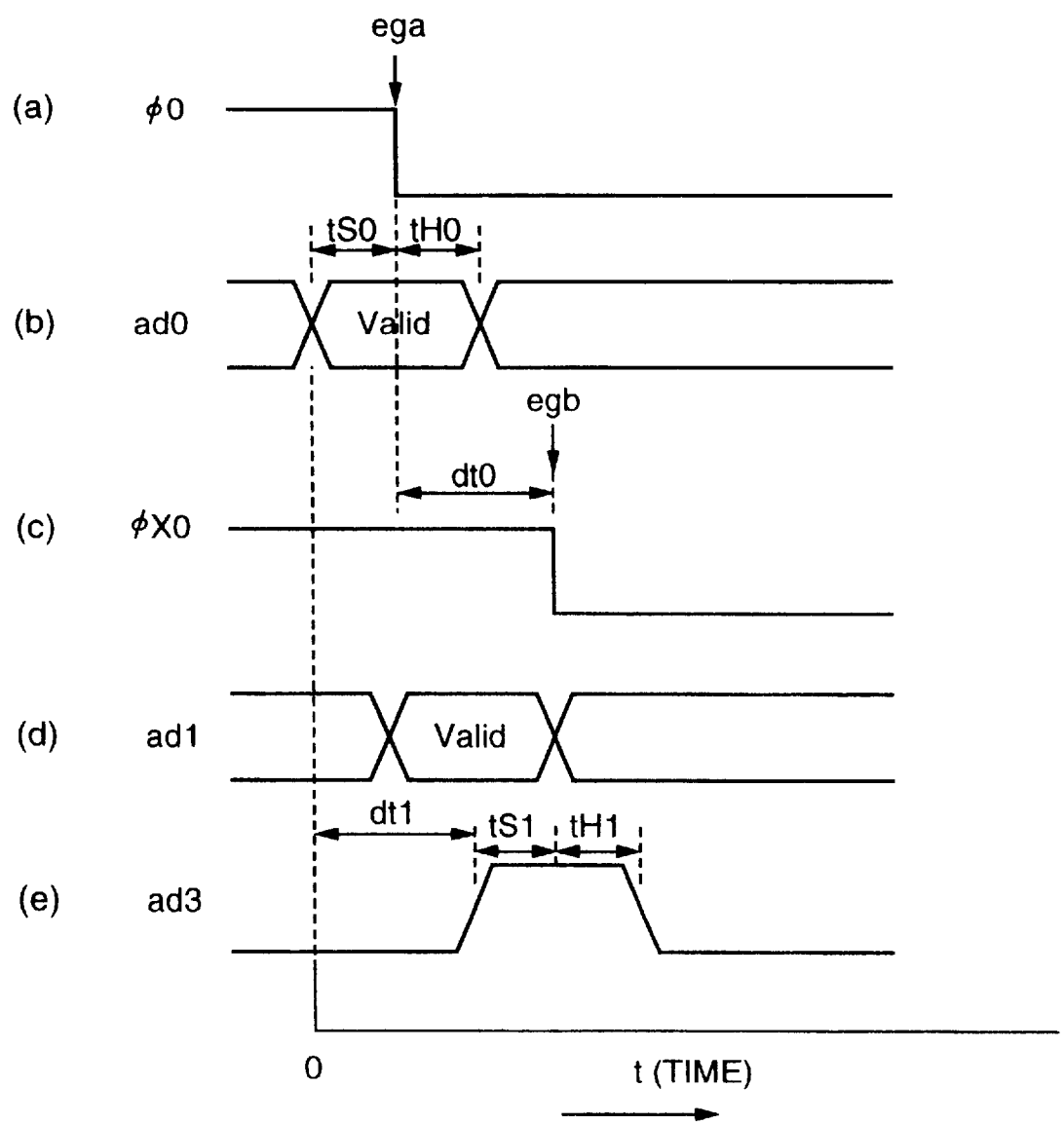
FIG. 3 is a time chart of an operation to latch an X pre-decoded signal in an X address latch in the first and the second embodiments.

This is explained in detail with reference to a time chart of FIG. 3 which shows an operation to latch the X pre-decoded signal ad3 in the X address latch 4.

Figure 6:
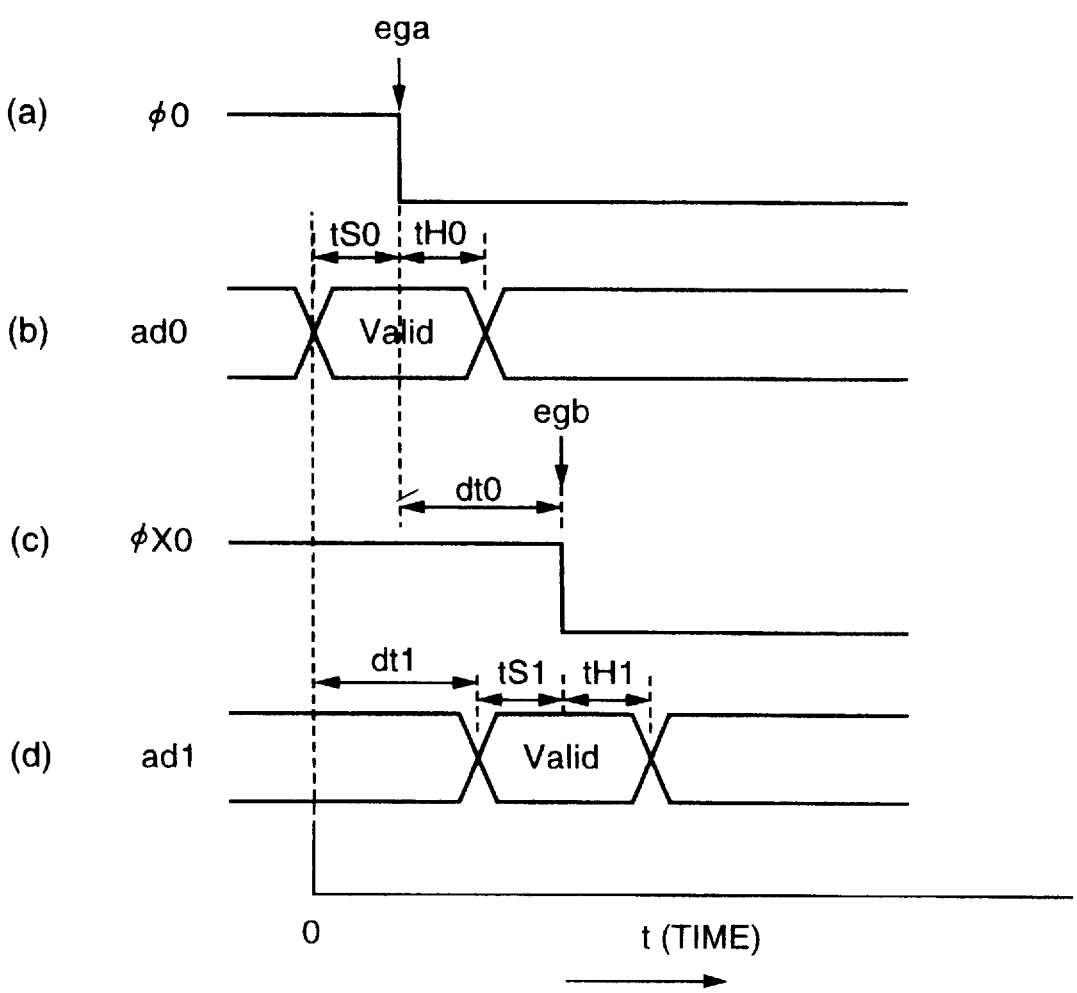
FIG. 6 is a time chart of an operation to latch an internal X address signal in an X address latch in the prior art addressing unit.

In FIGS. 3(a) and (b), the value of the address signal ad0 (Valid-data) is kept to be a high level or a low level in the setup period tS0 and the hold period tH0 in synchronism with the falling edge of the control signal φ0 as it is in the prior art shown in FIG. 6.

The address signal ad0 is translated to the internal X address signal ad1 by the buffer 1. The translation process is completed in a shorter time than the delay time dt0 from the fall of the control signal φ0 to the fall of the X latch signal φX0 (FIGS. 3(c) and (d)). Thus, the pre-decode process is conducted in the X pre-decoder 3 during the time period from the generation of the internal X address signal ad1 to the fall of the X latch signal φX0, and the resulting X pre-decoded signal ad3 is latched in the X address latch 4 when the control signal φ0 falls (FIGS. 3(c) and (e)).

As a result, in the present embodiment, after the latching, only the process by the X decoder 6 or the Y decoder 7 need be conducted. Since the time required for latching is same in the prior art and the present embodiment, the process in the present embodiment is faster than the prior art in which the pre-decode process and the decode process are conducted after the latching.

Figure 4:
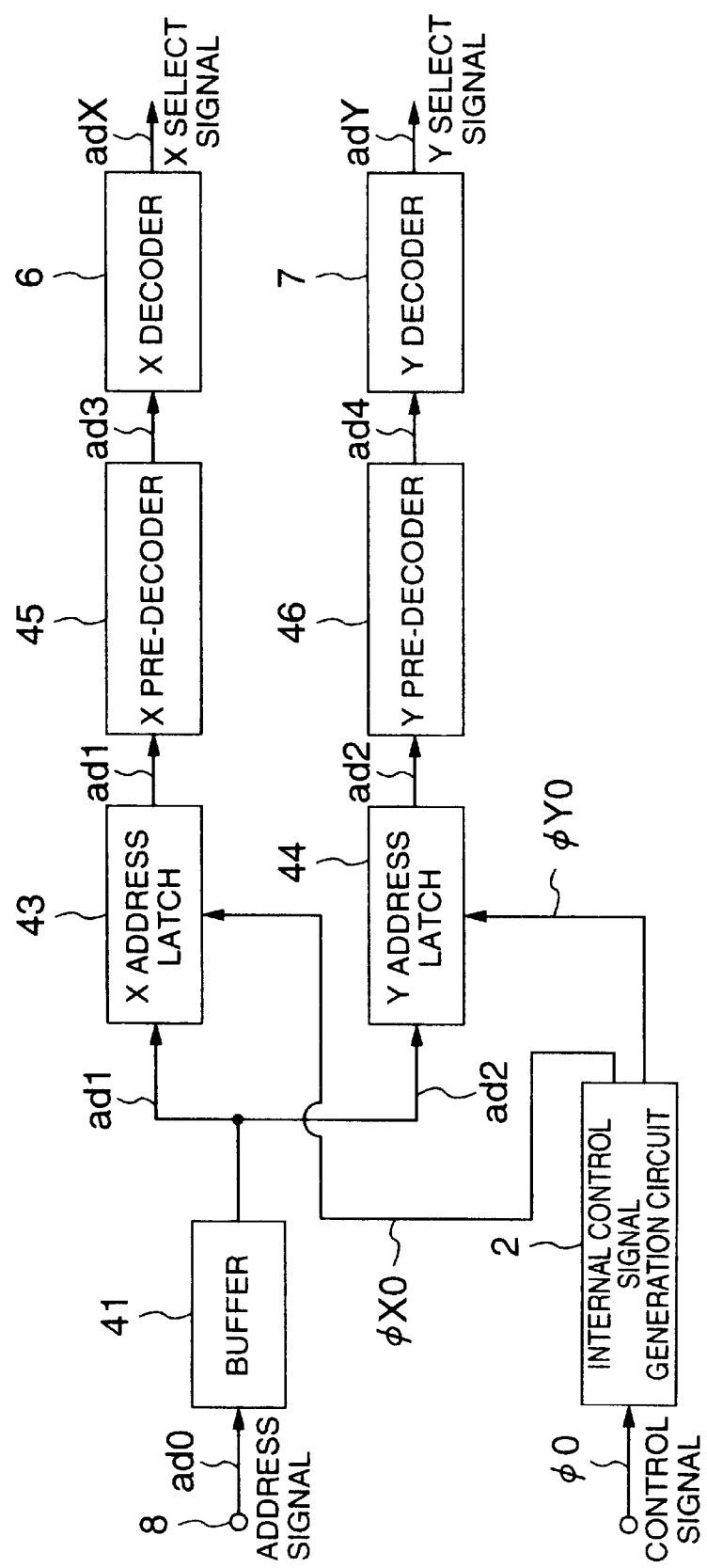
FIG. 4 is a block diagram of a configuration of a prior art addressing unit.

As is apparent from the comparison between FIG. 1 and FIG. 4, only one pre-decoder need be provided in the present embodiment, and therefore, the configuration is simpler. Further, in the present embodiment, it is not necessary to provide gates for setting an extra delay in the buffer 1. Namely, in the prior art buffer 41, five or six stages of gates are required while in the buffer 1 in the present embodiment, about two stages are sufficient, and therefore, the configuration of the buffer 1 is simple and the consumed current is small.

Figure 2:
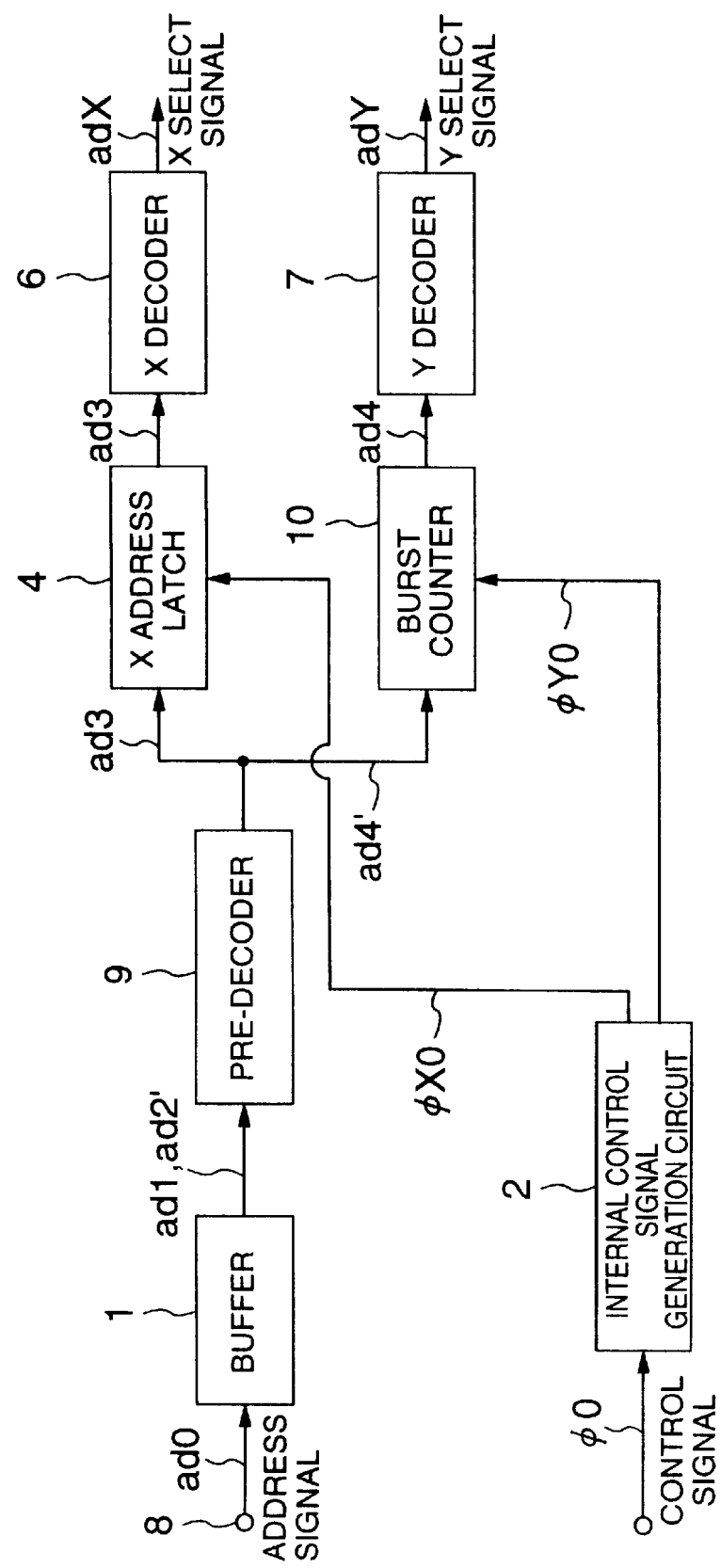
FIG. 2 is a block diagram of a configuration of an addressing unit according to a second embodiment.

A second embodiment of the present invention will now now explained. FIG. 2 is a block diagram of a configuration of an addressing unit according to the second embodiment. In FIG. 2, the blocks identical to those shown in FIG. 1 are designated by identical numerals and duplicate description is omitted.

Figure 5:
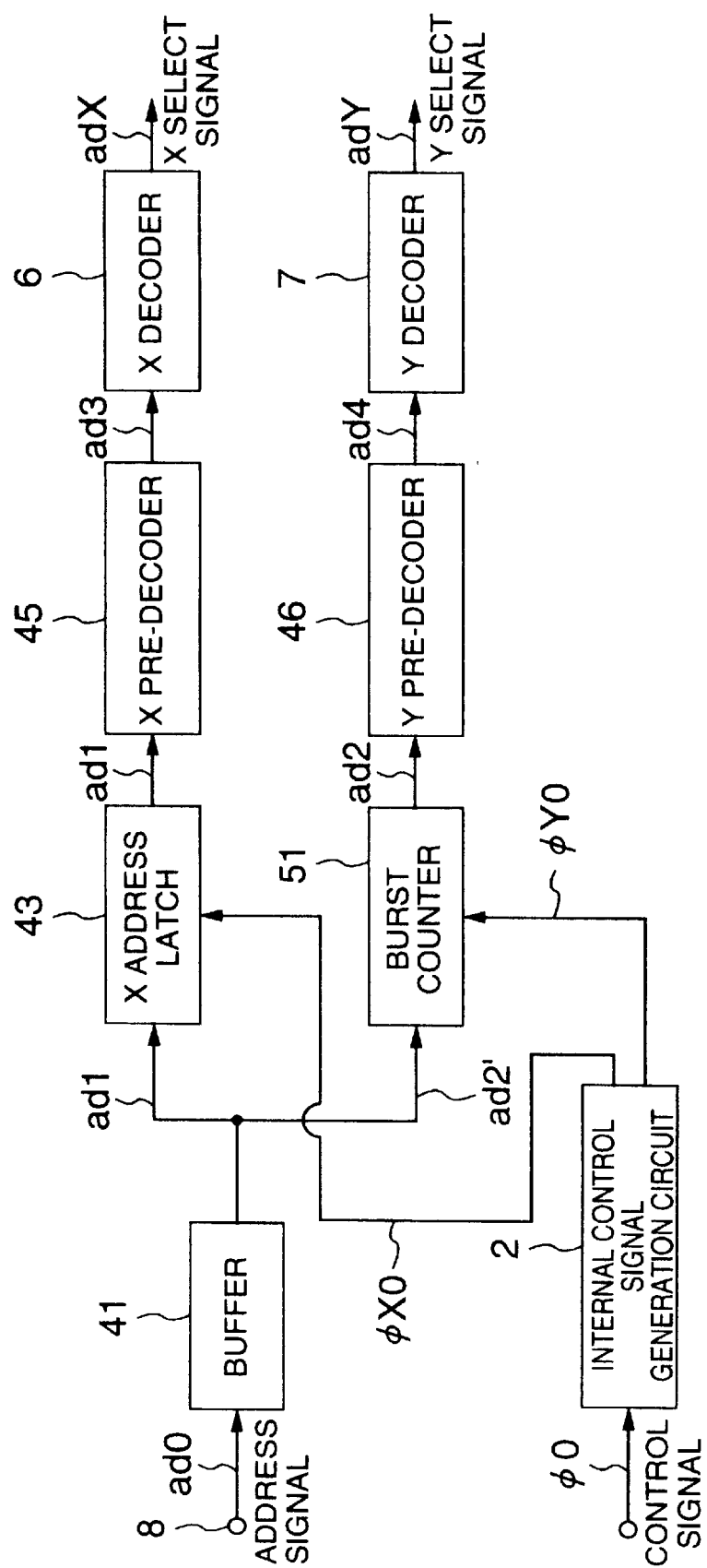
FIG. 5 is a block diagram of another configuration of the prior art addressing unit.

In the addressing unit according to the second embodiment as shown in FIG. 2, similarly to FIG. 5, the burst counter 10 is used instead of the Y address latch 5 of FIG. 1. The prior art burst counter 51 as shown in FIG. 5 is a 3-bit binary counter but, in the present embodiment, since the pre-decode process is conducted by the pre-decoder 9 provided in the preceding stage to the burst counter 10, the burst counter 10 is constructed by an 8-bit shift register.

In this manner, since the burst counter 10 is used in the present embodiment instead of the Y address latch 5 of FIG. 1, the pre-decoder 9 uses the first 3-bit data supplied from the buffer 1 as an initial value to be set in the burst counter 10 for the process of the Y address. The process of the X address is same as that of FIG. 1. For example of the process of the Y address, when the first 3-bit data is "000", the pre-decoder 9 sets "00000001" as the initial value in the burst counter 10 comprising the 8-bit shift register. The burst counter 10 subsequently shifts the bit of "1" in accordance with a clock, such as "00000010", "00000100", . . . , "10000000". The outputs of the burst counter 10 are sequentially supplied to the Y decoder 7 as the Y pre-decoded signal. When the first 3-bit data is "010", it means that the third signal line from the lowest position is selected and the initial value set in the burst counter 10 is "00000100".

The pre-decoder 9 in the present embodiment is different from the prior art Y pre-decoder 46 or the pre-decoder 3 in FIG. 1 in that only the first 3-bit address data ad2' included in the input internal Y address signal is translated to the first 8-bit address data ad4' to be included in the Y pre-decoded signal.

In the second embodiment, similarly to the first embodiment, the process of the buffer 1 and the pre-decoder 9 can be conducted during the delay time for the internal control signal generation circuit 2 to process the control signal φ0 to generate the X latch signal φX0 and the Y latch signal φY0 and supply them to the X address latch 4 and the burst counter 10. Accordingly, in the present embodiment, the processing speed is significantly faster than that of the prior art as shown in FIG. 5.

As is apparent from the comparison between FIG. 2 and FIG. 5, only one pre-decoder need be provided in the present embodiment, and therefore, the construction is simpler. Further, according to the present embodiment, it is not necessary to provide gate for setting an extra delay in the buffer 1, and therefore, the construction of the buffer 1 is simplified and the consumed current is reduced.

The addressing units according to the first embodiment and the second embodiment described above may be applied not only to the DRAM but also to other storage devices, such as an SRAM, so long as the storage device has an address latch circuit, a pre-decoder and a decoder.

In the addressing unit of the present invention, since the pre-decoder is arranged in the preceding stage to the address latch circuit, the pre-decoded signal from the pre-decoder is latched in the address latch circuit and the latched signal is decoded by the address decoder, the pre-decode process may be conducted in the same time required for the address latching in the prior art, and after the address latching, only the decode process need be conducted without the pre-decode process. Thus, the process is faster than the prior art addressing unit in which the pre-decode process and the decode process are conducted after the latching.

What is claimed is:

1. An addressing unit comprising:
   a pre-decoder for sequentially receiving a first address signal and a second address signal, and for sequentially pre-decoding a plurality of address data included in the first address signal and pre-decoding a first one of a plurality of address data included in the second address signal;

an address latch circuit for latching said plurality of address data included in the pre-decoded first address signal;

a burst counter for latching the first one of said plurality of address data included in the pre-decoded second address signal and sequentially shifting the latched address data to generate a plurality of address data;

a control signal generating circuit for generating a first control signal for controlling timing to latch the pre-decoded first address signal and a second control signal for controlling timing to latch the pre-decoded second address signal, and for supplying the first and second control signals to said address latch circuit and said burst counter respectively;

a first address decoder for decoding said plurality of address data output from said address latch circuit; and a second address decoder for decoding said plurality of address data generated by said burst counter.

2. An addressing unit according to claim 1, wherein said pre-decoder pre-decodes the address signal input by n bits to signals to identify $2^n$ address lines.

3. An addressing unit comprising:

an address buffer for receiving a multiplexed address signal of a first address signal and a second address signal to generate a first internal address signal from the first address signal and generate a second internal address signal from the second address signal;

a pre-decoder for sequentially receiving the first address signal and the second address signal, and for sequentially pre-decoding a plurality of address data included in the first internal address signal and pre-decoding a first one of a plurality of address data included in the second internal address signal;

an address latch circuit for latching said plurality of address data included in the pre-coded first internal address signal;

a burst counter for latching the first one of said plurality of address data included in the pre-decoded second internal address signal and sequentially shifting the latched address data to generate a plurality of address data;

a control signal generating circuit for generating a first control signal for controlling timing to latch the address data included in the pre-decoded first internal address signal and a second control signal for controlling timing to latch the address data included in the pre-decoded second internal address signal, and for supplying the first and second control signals to said address latch circuit and said burst counter respectively;

a first address decoder for decoding said plurality of address data output from said address latch circuit; and a second address decoder for decoding said plurality of address data generated by said burst counter.

4. An addressing unit according to claim 3, wherein said pre-decoder pre-decodes the address signal input by n bits to signals to identify $2^n$ address lines.

* * * * *